United States Patent [19]
Kang et al.

[11] Patent Number: 5,892,500
[45] Date of Patent: Apr. 6, 1999

[54] REMOTE CONTROLLER

[75] Inventors: Suck-woo Kang; Tae-hun Lee, both of Suwon, Rep. of Korea

[73] Assignee: Samsung Electronics Co., Ltd., Suwon, Rep. of Korea

[21] Appl. No.: 903,144

[22] Filed: Jul. 30, 1997

[30] Foreign Application Priority Data

Aug. 12, 1996 [KR] Rep. of Korea ............. 96-33466
Nov. 2, 1996 [KR] Rep. of Korea ............. 96-51706

[51] Int. Cl.⁶ ..................................... G09G 5/08
[52] U.S. Cl. ........................................... 345/157
[58] Field of Search .............. 348/734; 345/157, 345/156, 158, 155

[56] References Cited

U.S. PATENT DOCUMENTS

| | | | |
|---|---|---|---|
| 5,291,054 | 3/1994 | Tamaka et al. | 257/433 |
| 5,537,152 | 7/1996 | Ishikawa | 348/734 |
| 5,650,831 | 7/1997 | Farwell | 348/734 |
| 5,652,630 | 7/1997 | Bertram et al. | 348/734 |
| 5,670,988 | 9/1997 | Tickle | 345/157 |
| 5,724,106 | 3/1996 | Autry et al. | 348/734 |
| 5,737,028 | 11/1995 | Bertram et al. | 348/734 |
| 5,774,114 | 9/1995 | Suzuki | 345/157 |

FOREIGN PATENT DOCUMENTS

| | | | |
|---|---|---|---|
| 2627883 | 9/1989 | France | G08C 17/00 |
| 06209495 | 7/1994 | Japan | H04Q 9/00 |
| 07154868 | 6/1995 | Japan | H04Q 9/00 |
| WO 90/08392 | 7/1990 | WIPO | H01H 9/02 |

*Primary Examiner*—Mark K. Zimmerman
*Assistant Examiner*—Ronald Laneau
*Attorney, Agent, or Firm*—Dilworth & Barrese

[57] ABSTRACT

In a remote controller, a conductive air mouse button is electrically connected to one terminal of a battery. A conductive lower case is electrically connected to the other terminal of said battery. Light-emitting and light-receiving devices which transmit/receive radio signals when said air mouse button and said lower case are contacted by fingers, to thereby be electrically connected to form a closed circuit.

8 Claims, 3 Drawing Sheets

REMOTE CONTROLLER

BACKGROUND OF THE INVENTION

The present invention relates to a remote controller, and more particularly, to a remote controller having an improved structure to reduce battery consumption. Also, the present invention relates to a remote controller by which the selected mode of electronic products can be easily recognized.

A remote controller is widely used for the convenience of users of electronic products such as television sets. A dry cell or a storage battery is usually used as a power supply means for the remote controller. Thus, minimization of battery consumption is required to extend the use time of the remote controller.

In the meantime, the latest remote controller adopts an air mouse function which enables a user to select from a menu displayed on a monitor by moving a cursor arrow to a desired menu item and pressing an air mouse button. In this case, since the mouse cursor must continuously be displayed on the monitor, the power of the remote controller must be kept on, thus draining the battery.

An example of a conventional remote controller which concurrently operates a television set, a VCR and a CD player is shown in FIG. 1. As shown in the drawing, when a user presses any one of mode buttons 1 on the remote controller in order to select a desired mode, a display lamp 2 corresponding to the selected mode is lit such that the selected mode can be visually recognized.

However, the user cannot be sure of the selected mode after the display lamp 2 is off. That is, when the user wishes to operate another mode, e.g., another electronic product, other than the selected mode, for example, to control a TV set while in a VCR mode, the user may not realize that the TV mode is not selected until they press a button for a TV function many times to operate the TV, and realize that it does not work. Then, they must press the TV mode button to set the TV mode.

In one proposal to solve the above problem, when a user presses an arbitrary button on the remote controller, the display lamp 2 thereon is lit according to a set mode so that the currently selected mode can be noticed by the user.

The drawback in such proposed remote controller is that the arbitrary button must be pressed to confirm which mode is set.

SUMMARY OF THE INVENTION to overcome the above problems, it is an objective of the present invention to provide a remote controller of which power is turned on by contacting an air mouse button to use an air mouse function.

It is another objective of the present invention to provide a remote controller having an improved structure such that a display lamp is lit to indicate the currently set mode when a user holds the remote controller.

Accordingly, to achieve the first objective, there is provided a remote controller comprising: a conductive air mouse button electrically connected to one terminal of a battery; a conductive lower case electrically connected to the other terminal of the battery; and a light-emitting device and a light-receiving device which transmit and receive radio signals when the air mouse button and the lower case are contacted by fingers, to thereby be electrically connected to form a closed circuit.

To achieve the second objective, there is provided a remote controller comprising: a conductive upper cover; a conductive battery cover, installed in a lower case which is coupled with the upper cover; a circuit board installed between the upper cover and the lower case and receiving power from a battery; a display lamp installed on the upper cover, for indicating a selected mode according to a signal generated from the circuit board; and conductive elastic pieces for electrically connecting the upper cover and the circuit board, and the battery cover and the circuit board, respectively.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
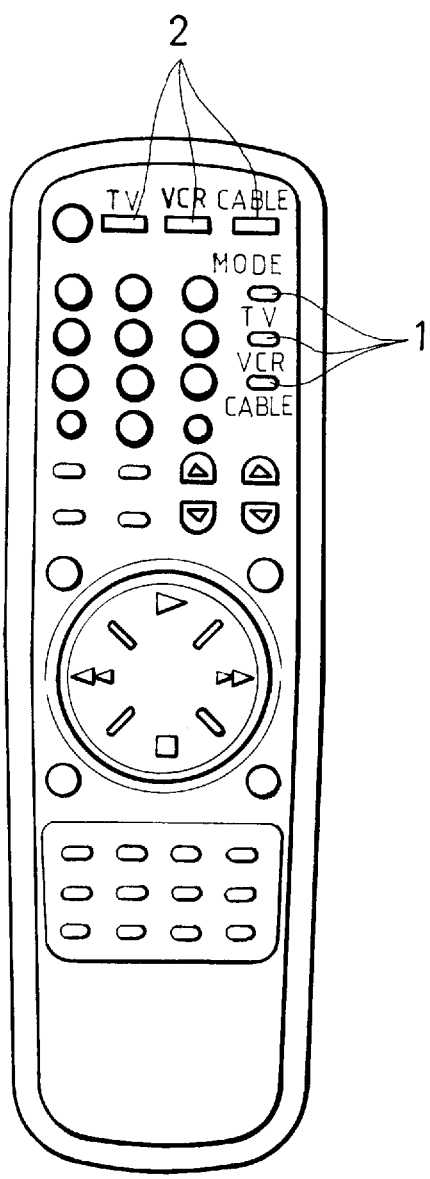
FIG. 1 is a plan view illustrating a conventional remote controller.
Figure 2:
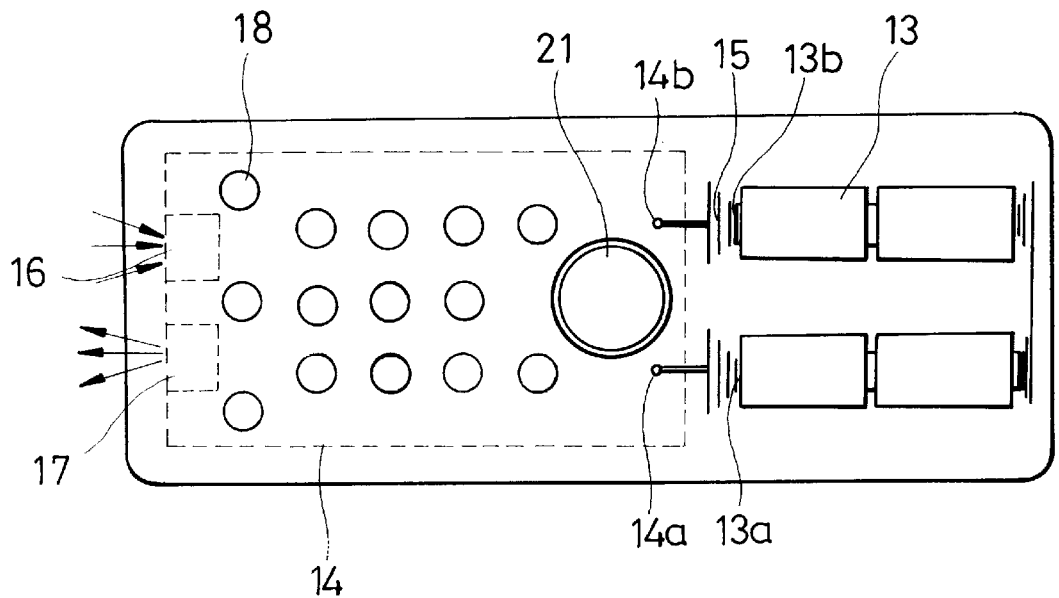
FIG. 2 is a horizontal cross section of a remote controller according to an embodiment of the present invention.
Figure 3:
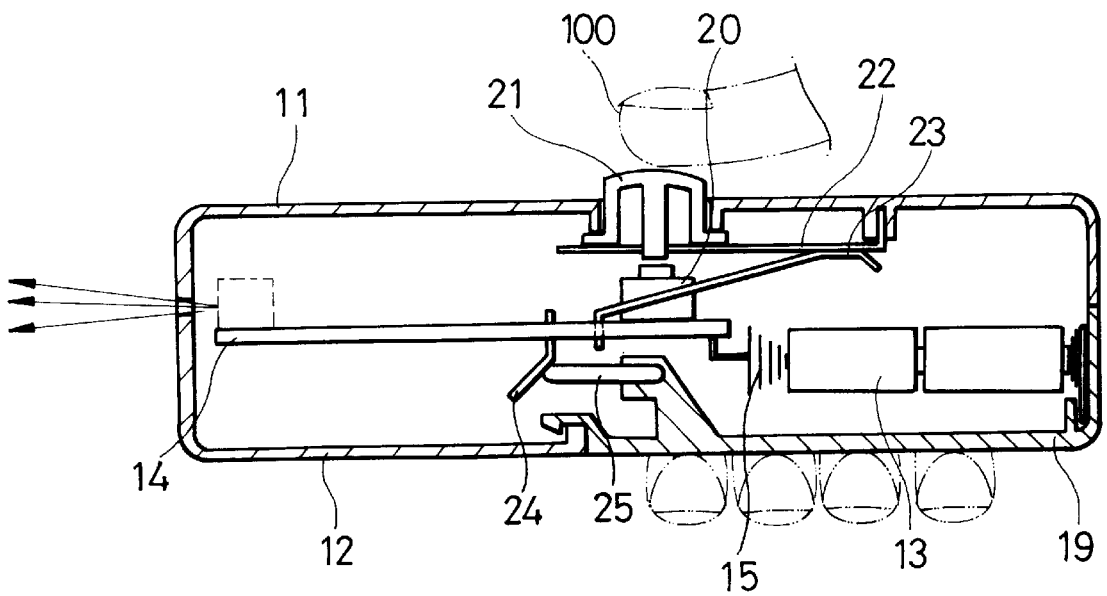
FIG. 3 is a vertical cross section of the remote controller shown in FIG. 2.

Referring to FIGS. 2 and 3, the main body of a remote controller according to an embodiment of the present invention is comprised of upper and lower cases 11 and 12. In the main body of the remote controller, a plurality of batteries 13 and a circuit board 14 are installed. The circuit board 14 is connected to a terminal spring 15 which is in contact with the batteries 13 to receive power from the batteries 13. Here, the lower case 12 is formed of a conductive material. A light-emitting device 17 and a light-receiving device 16, for transmitting and receiving signals, provided at one end of the circuit board 14. Also, reference numeral 18 indicates buttons of the remote controller and reference numeral 19 indicates a battery door for changing the batteries. The battery door 19 forms a portion of the lower case 12.

A tact switch 20 which is electrically connected to the circuit board 14 is installed on the upper surface of the circuit board 14. The tact switch 20 is positioned under an air mouse button 21 so that, when a user presses the air mouse button 21 with his finger 100, the tact switch 20 is operated to generate signals.

The air mouse button 21 is formed of a conductive material and protrudes from the upper case 11 while being supported by a leaf spring 22. The leaf spring 22 is in contact with a connection spring 23 which elastically presses against the leaf spring 22 so as to electrically contact a cathode terminal portion 14a of the circuit board 14.

The remote controller having the above structure forms an open circuit: that is, one path from a cathode terminal 13a of the battery 13, the cathode terminal portion 14a of the circuit board 14, the connection spring 23, the leaf spring 22, to the air mouse button 21; and another path from an anode terminal 13b of the battery 13, an anode terminal portion 14b of the circuit board 14, a spring member 24, a ground pin 25, to the battery door 19 or the lower case 12.

When a user contacts the air mouse button 21 with his finger 100 to use the air mouse function while holding the remote controller as shown in FIG. 2, the open circuit forms a closed circuit by means of the user's hand. That is, the lower case 12 and the air mouse button 21 are electrically connected by the hand.

At this time, the charge of the battery 13 starts to be consumed as the light-emitting device 17 and the light-receiving device 16 operate so that a cursor arrow for selecting from a menu is displayed on a screen. Accordingly, a user moves the cursor arrow and presses the air mouse button 21 thereby selecting a desired menu. The pressed air mouse button 21 returns to its initial position by the elastic force of the leaf spring 22 and the connection spring 23.

When the finger 100 is detached from the air mouse button 21 after the use of the air mouse function is completed, the closed circuit is broken and thus the consumption of the battery charge is stopped. That is, charge is consumed for performing the air mouse function only while the remote controller is held by hand.

Thus, the remote controller according to the present invention can reduce the battery consumption for using the air mouse function.

Figure 4:
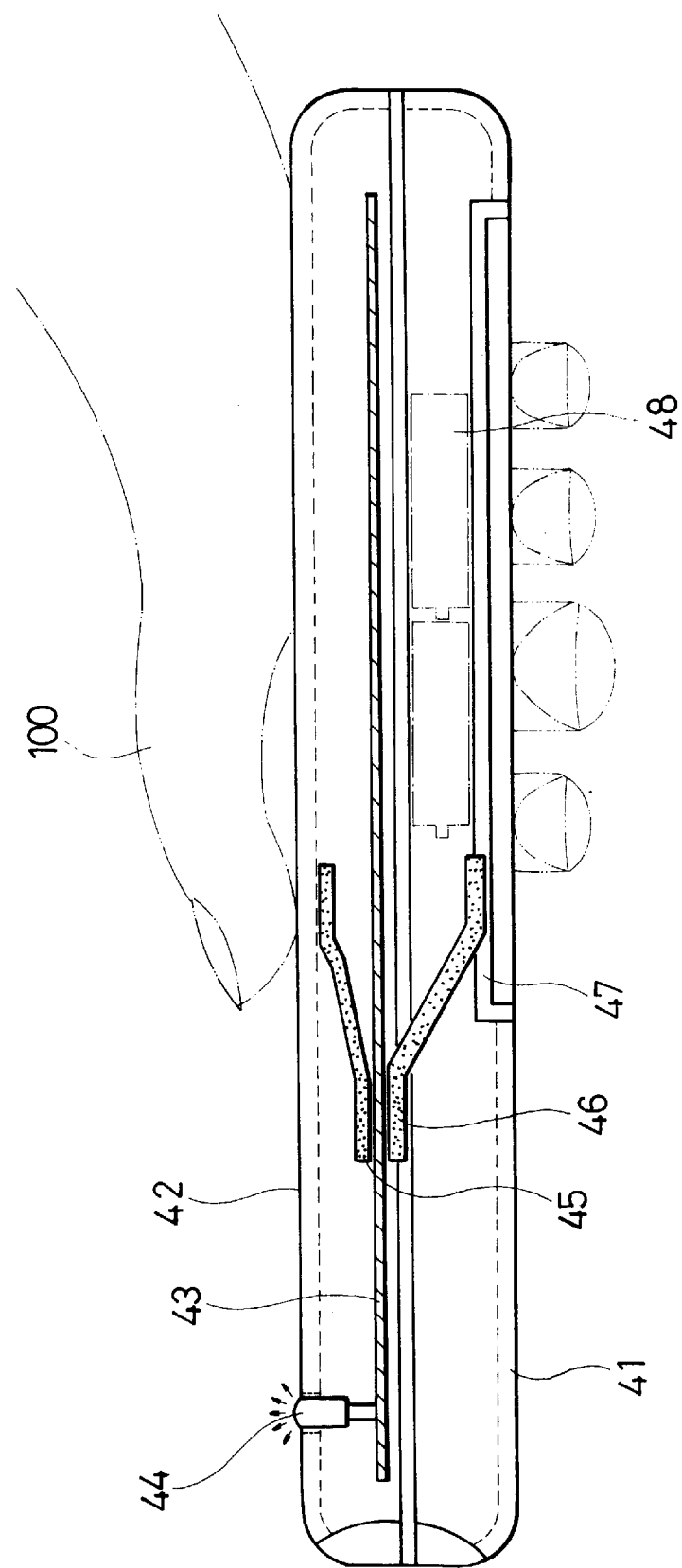
FIG. 4 is a vertical cross section of a remote controller according to another embodiment of the present invention.

FIG. 4 shows a remote controller according to another embodiment of the present invention. Referring to the drawing, the remote controller of the present embodiment comprises a lower case 41 and an upper cover 42. A battery cover 47 is installed in the lower case 41. It is a characteristic feature of the present embodiment of the present invention that the upper cover 42 and the battery cover 47 are formed of a conductive material.

A circuit board 43 is installed inside the remote controller, and a mode display lamp 44 which is electrically connected to the circuit board 43 is installed in the upper cover 42.

The upper cover 42 and the battery cover 47 are electrically connected to the circuit board 43 by means of first and second conductive elastic pieces 45 and 46, respectively. The first and second elastic pieces 45 and 46 elastically support the upper cover 42 and the battery cover 47, respectively.

A weak current, just enough for a microcomputer to generate signals, is supplied from a battery 48 to the circuit board 43. Thus, when a user holds the remote controller, current from the battery 48 flows through the circuit board 43, the second elastic piece 46, the battery cover 47, the finger 100, the upper cover 42 and the first elastic piece 45. Thus, signals are generated on the circuit board 43 by the current, and the generated signals are transmitted to the microcomputer (not shown) to make the display lamp 44 emit light for a predetermined time according to a selected mode. It is preferable that the light-emitting time of the display lamp 44 is appropriately determined considering the power consumption and time needed for recognizing the selected mode by a user.

As described above, according to the present invention, it is easy to recognize a selected mode without further pressing the buttons on the remote controller to confirm the selected mode.

What is claimed is:

1. A remote controller comprising:
    a conductive air mouse button electrically connected to one terminal of a battery;
    a conductive lower case electrically connected to the other terminal of said battery; and
    a light-emitting device and a light-receiving device which transmit and receive radio signals when said air mouse button and said lower case are contacted by fingers, to thereby be electrically connected to form a closed circuit.

2. A remote controller as claimed in claim 1, further comprising:
    a circuit board having an anode terminal portion and a cathode terminal portion which are electrically connected to the corresponding terminals of said battery;
    a tact switch which is installed on the upper surface of said circuit board and under said air mouse button, and which is pressed when said air mouse button is pressed;
    a first connecting means for electrically connecting said anode terminal portion of said circuit board and said lower case; and
    a second connecting means for electrically connecting said cathode terminal portion of said circuit board and said air mouse button.

3. A remote controller as claimed in claim 2, wherein said first connecting means comprises:
    a spring member electrically connected to said circuit board; and
    a ground pin fixed to said lower case and having one end thereof in contact with said spring member.

4. A remote controller as claimed in claim 2, wherein said second connecting means comprises:
    a leaf spring for elastically supporting said air mouse button; and
    a connection spring for providing an elastic force to said leaf spring, one end of said connection spring being fixed to said circuit board and the other end thereof being in a contact with said leaf spring.

5. A remote controller comprising:
    a conductive upper cover;
    a conductive battery cover, installed in a lower case which is coupled with said upper cover;
    a circuit board installed between said upper cover and said lower case and receiving power from a battery;
    a display lamp installed on said upper cover, for indicating a selected mode according to a signal generated from said circuit board; and
    conductive elastic pieces for electrically connecting said upper cover and said circuit board, and said battery cover and said circuit board, respectively.

6. A remote controller as claimed in claim 5, wherein said elastic pieces are for elastically supporting said upper cover and said battery cover, respectively.

7. A remote controller comprising:
    a housing having an upper portion and a lower portion;
    means for wirelessly transmitting control signals to a remote wireless receiving device;
    a button for activating said means for wirelessly transmitting when said button is depressed,
    said button being electrical connected to a first of two terminals of a battery, said lower portion of said housing being electrically connected to a second of said terminals of said battery to form a close circuit upon a user grasping said remote controller and pressing said button.

8. The remote controller of claim 7, further including an optical indicating means which is turned on upon the forming of said close circuit.

* * * * *